United States Patent
Liu et al.

(10) Patent No.: US 6,822,601 B1
(45) Date of Patent: Nov. 23, 2004

(54) BACKGROUND-CALIBRATING PIPELINED ANALOG-TO-DIGITAL CONVERTER

(75) Inventors: Hung-Chih Liu, Hsin-Chu (TW); Jieh-Tsomg Wu, Hsin-Chu (TW); Zwei-Mei Lee, Tao-Yuan Hsien (TW)

(73) Assignee: Silicon Integrated Systems Corp., Hsin-Chu (TW)

( * ) Notice: Subject to any disclaimer, the term of this patent is extended or adjusted under 35 U.S.C. 154(b) by 0 days.

(21) Appl. No.: 10/604,458

(22) Filed: Jul. 23, 2003

(51) Int. Cl.[7] .............................................. H03M 1/38
(52) U.S. Cl. ........................ 341/161; 341/150; 341/120
(58) Field of Search .................................. 341/155, 161, 341/118, 120, 150

(56) References Cited

U.S. PATENT DOCUMENTS

| | | | | |
|---|---|---|---|---|
| 5,635,937 A | * | 6/1997 | Lim et al. ................... | 341/161 |
| 5,929,796 A | | 7/1999 | Opris et al. | |
| 5,977,894 A | * | 11/1999 | McCarroll et al. .......... | 341/120 |
| 6,259,392 B1 | * | 7/2001 | Choi et al. ................... | 341/150 |
| 6,489,904 B1 | * | 12/2002 | Hisano ........................ | 341/120 |
| 6,545,628 B1 | * | 4/2003 | Aram ........................... | 341/155 |

* cited by examiner

Primary Examiner—Jean Bruner Jeanglaude
(74) Attorney, Agent, or Firm—Winston Hsu

(57) ABSTRACT

A multiplying digital-to-analog converter (MDAC) stage includes a plurality of second capacitances in parallel selectively connected between an input node and an amplifier input and between a corresponding plurality of digital reference signals, which can include a pseudo-random first calibration signal, and the amplifier input. A pipelined ADC incorporating a series of such MDAC stages includes a multiplier connected to the last MDAC stage of the series, a low-pass filter for filtering output of the multiplier and outputting a DC component, and an encoder for receiving output of the MDAC stages and generating a digital output signal and for compensating the digital output signal with the DC component. Background calibration of the ADC includes applying the first calibration signal to a second capacitance of the MDAC stage during a hold phase, and filtering the first calibration signal from the digital output of the pipelined analog-to-digital converter.

11 Claims, 10 Drawing Sheets

BACKGROUND-CALIBRATING PIPELINED ANALOG-TO-DIGITAL CONVERTER

BACKGROUND OF INVENTION

1. Field of the Invention

The present invention relates to digital electronics, and more specifically, to a background calibrating pipelined analog-to-digital converter.

2. Description of the Prior Art

Pipelined analog-to-digital converters (ADCs) are widely used in applications such as video imaging systems, digital subscriber loops, Gigabit Ethernet transceivers, and wireless communications. Pipelined analog-to-digital (A/D) conversion offers a good trade-off among power, speed, and integrated circuit die area, and is suitable for implementing high-resolution ADCs operating at sampling frequencies in the order of megahertz.

FIG. 1 illustrates a state-of-the-art pipelined ADC 10. The ADC 10 includes a series of multiplying digital-to-analog converter (MDAC) stages 12, 14, 16, which may or may not be identical, and an encoder 18. The first MDAC stage 12 receives an analog signal $V_1$ and outputs a digital code $D_1$ representative of the analog signal $V_1$ according to a pre-defined precision. Successive stages 14, 16 output digital codes $D_2$, $D_3$ according to successive amplified residual signals $V_2$, $V_3$ of the first and second stages 12, 14 respectively. Each successive stage digitizes the residue of the previous stage, so accordingly, the digital output $D_1$ of the first stage 12 contains the most significant bits (MSBs) while the output $D_p$ of the last stage 16 contains the least significant bits (LSBs). The encoder 18 arranges the outputs $D_1$, $D_2$, $D_3$ of the stages 12, 14, 16 to produce a consistent digital representation $D_0$ of the input analog signal $V_1$.

FIG. 2 illustrates a typical MDAC 20 used for the MDAC stages 12, 14, 16 of the ADC 10 of FIG. 1. The MDAC 20 includes an internal ADC 22, a digital-to-analog converter (DAC) 24, an adder 26, and an amplifier 28. In operation, an analog input $V_j$ received from a previous stage (or as an input signal itself) is quantized by the ADC 22 producing a digital code $D_j$ that is an estimation of $V_j$. The DAC 24 generates a corresponding analog signal $V_j^{da}(D_j)$ that is then subtracted from the input signal $V_j$ by the adder 26. The residue outputted by the adder 26 is amplified by the amplifier 28 according to a gain factor $G_j$. The output $V_{j+1}$ of the MDAC 20 can be described as follows:

$$V_{j+1} = G_j \times [V_j - V^{da}(D_j)] \quad (1)$$

Accordingly, the input of the pipelined ADC 10 can then be expressed as:

$$V_1 = V_1^{do} + \frac{V_2^{do}}{G_1} + \frac{V_3^{do}}{G_1 G_2} + \cdots + \frac{V_p^{do}}{G_1 G_2 \cdots G_{p-1}} + Q \quad (2)$$

where $Q=V_{P+1}/(G_1 G_2 \ldots G_P)$ is the quantizing error of the entire A/D conversion. The encoder 18 of FIG. 1 calculates the digital output $D_0$ by subtracting Q from $V_1$. The signals $V_j^{da}$ and gains $G_j$ are design parameters. In addition, it is well known that the conversion characteristics of the internal ADC 22 in the pipeline stages 20 have no effect on the digital output $D_0$.

In CMOS applications, most A/D pipeline stages are realized with switched-capacitor (SC) MDACs, which include comparators, operational amplifiers (opamps), switches, and capacitors as described above. FIG. 3 shows a prior art radix-2 1.5 bit SC MDAC 30 having a conversion characteristic as illustrated in FIG. 4. The MDAC 30 includes comparators 32, 34, an encoder 36, switches 38, first and second capacitors 40, 42 having respective capacitances C and C, and an operational amplifier 44. During a sample phase, when a first clock is high, the switches 38 marked 1 are exclusively closed, and the signal $V_j$ is sampled on the first and second capacitors 40, 42. Accordingly, the digital code output is determined as −1, 0, or +1 according to the comparators 32, 34 comparing the signal $V_j$ with +0.25V and −0.25$V_r$ references respectively. Conversely, during a hold phase, when a second clock is high, the switches 38 marked 2 are exclusively closed. During the hold phase, the output $V_{j+1}$ can be expressed as:

$$V_{j+1} = \left(1 + \frac{C_s}{C_f}\right) \times \left[V_j - \frac{C_s}{C_s + C_f} V_p \cdot D_j\right] \quad (3)$$

assuming linear behavior of the capacitors 40, 42, and an ideal operational amplifier 44 with infinite DC gain and zero input offset voltage. In practical application, the capacitances $C_f$ and $C_s$ of the capacitors 40, 42 are desired to be the same. However, due to capacitance mismatches (C fnot equal to C) and input offset voltage of the operational amplifier 44 in implementation, the pipelined ADC 10 must be calibrated for accurate results. Regarding calibration, there is a fundamental trade-off between ADC operation speed and accuracy, which depends on the matching properties of devices such as MOSFETs and capacitors. The accuracy of an MDAC is dictated by the input offset voltages of the comparators and the operational amplifier, and the exact values of the capacitor ratios. To overcome this speed-accuracy trade-off, several self-calibration techniques have been developed. Although the calibration can be performed in the analog domain, entirely digital approaches are preferred in deep sub-micron technologies, due to reduced cost of added digital circuitry. In addition, in digital self-calibration schemes the necessary modification to the MDACs is noncritical, and thus, the analog signal paths suffer little performance degradation.

Conventional self-calibration schemes require reconfiguration of MDACs, which cannot be performed without interrupting normal A/D operation. Thus, in applications that can afford little idle time, ADCs are calibrated only during an initial power-on state. Any power-on calibration may later become invalid because of variations in supply voltage and temperature. To address this problem, several background calibration schemes have been developed that enable an ADC to continuously calibrate internal MDACs to track environmental changes while simultaneously performing normal conversion without resolution degradation.

There are several well-known approaches to background calibration. The "skip-and-fill" algorithm randomly skips A/D cycles to calibrate the MDACs and fill in the missing outputs by nonlinear interpolation, as described in U.K. Moon and B.S. Song, "Background digital calibration techniques for pipelined ADCs", IEEE Trans. Circuits Syst. II, vol. 44, pp. 102–109, February 1997 and S. U. Kwak, B. S. Song, and K. Bacrania, "A 15-b, 5-Msample/s lowspurious CMOS ADC", IEEE J. Solid-State Circuits, vol. 32, pp. 1866–1875, December 1997, which are incorporated herein by reference. However, the bandwidth of the input signal needs to be limited for the interpolator to achieve good results. Moreover, if a multi-bit MDAC is used in a pipeline stage, it is possible to estimate the MDACs conversion errors in normal A/D operation using information on the MDACs mismatch pattern. But, without the MDACs gain error information, this approach is only suitable for high gain pipeline stages.

Background calibration can also be achieved by using an extra MDAC to replace the one under calibration, as described in J. M. Ingino and B. A. Wooley, "A continuously calibrated 12-b, 10-MS/s, 3.3V A/D converter", IEFE J. Solid-State Circuits, vol. 33, pp. 1920–1931, December 1998, which is incorporated herein by reference. However, the complexity of the required analog switching scheme can degrade speed performance of the analog signal path.

Another scheme proposed in J. Ming and S. H. Lewis, "An 8-bit 80-Msample/s pipelined analog-to-digital converter with background calibration," IEEE J. Solid-State Circuits, vol. 36, pp. 1489–1497, October 2001, which is incorporated herein by reference, is only capable of correcting gain error while adding significant analog and digital hardware.

Finally, an example of a self-calibrating reversible pipeline ADC/DAC is disclosed in U.S. Pat. No. 5,929,796, which is incorporated herein by reference.

The conventional background calibration schemes are in need of improvement with respect to nonlinear effects due to MDAC gain error, input offset voltage, and output errors in the digital-to-analog conversion.

SUMMARY OF INVENTION

It is therefore a primary objective of the claimed invention to provide an MDAC stage, a background-calibrating pipelined ADC, and a related method to overcome the above-described shortcomings of the prior art.

Briefly summarized, an MDAC stage according to the claimed invention includes a sub-analog-to-digital converter for converting an analog signal received at an input node to a digital code, an amplifier, and a first capacitance selectively connected between the input node and the amplifier input and between the amplifier input and the amplifier output. The claimed MDAC further includes a plurality of second capacitances connected in parallel selectively between the input node and the amplifier input and between a corresponding plurality of digital reference signals and the amplifier input. The plurality of digital reference signals comprises digital signals corresponding to the digital code and a first calibration signal. During a sample phase the first capacitance is connected between the input node and the amplifier input and the plurality of second capacitances are connected in parallel between the input node and the amplifier input. During a hold phase the first capacitance is connected between the amplifier input and the amplifier output and the plurality of second capacitances are connected in parallel between the plurality of digital reference signals and the amplifier input.

According to the claimed invention, a pipelined ADC incorporating a series of claimed MDAC stages includes a multiplier connected to the output of the last MDAC stage of the series. The multiplier is capable of determining a product of the last MDAC stage output and a second calibration signal corresponding to the first calibration signal. Further provided are a low-pass filter connected to the multiplier for filtering output of the multiplier and outputting a DC component, and an encoder for receiving output of the MDAC stages and generating a digital output signal, and for compensating the digital output signal with the DC component.

According to the claimed invention, a method includes steps of sampling an input analog signal on a first capacitance and a plurality of second capacitances of an MDAC stage during a sample phase, applying a first calibration signal to a second capacitance of the MDAC stage during a hold phase, and finally, filtering the first calibration signal from the digital output of the pipelined analog-to-digital converter.

It is an advantage of the claimed invention that the plurality of second capacitances and the first calibration signal allow for calibration without interruption of normal A/D conversion.

It is a further advantage of the claimed invention that the plurality of second capacitors results in no significant extra capacitive loads so that operating speed is not degraded.

It is a further advantage of the claimed invention that nonlinear effects due to gain error, input offset voltage, and output errors in the digital-to-analog conversion are reduced.

These and other objectives of the claimed invention will no doubt become obvious to those of ordinary skill in the art after reading the following detailed description of the preferred embodiment that is illustrated in the various figures and drawings.

DETAILED DESCRIPTION

Figure 5:
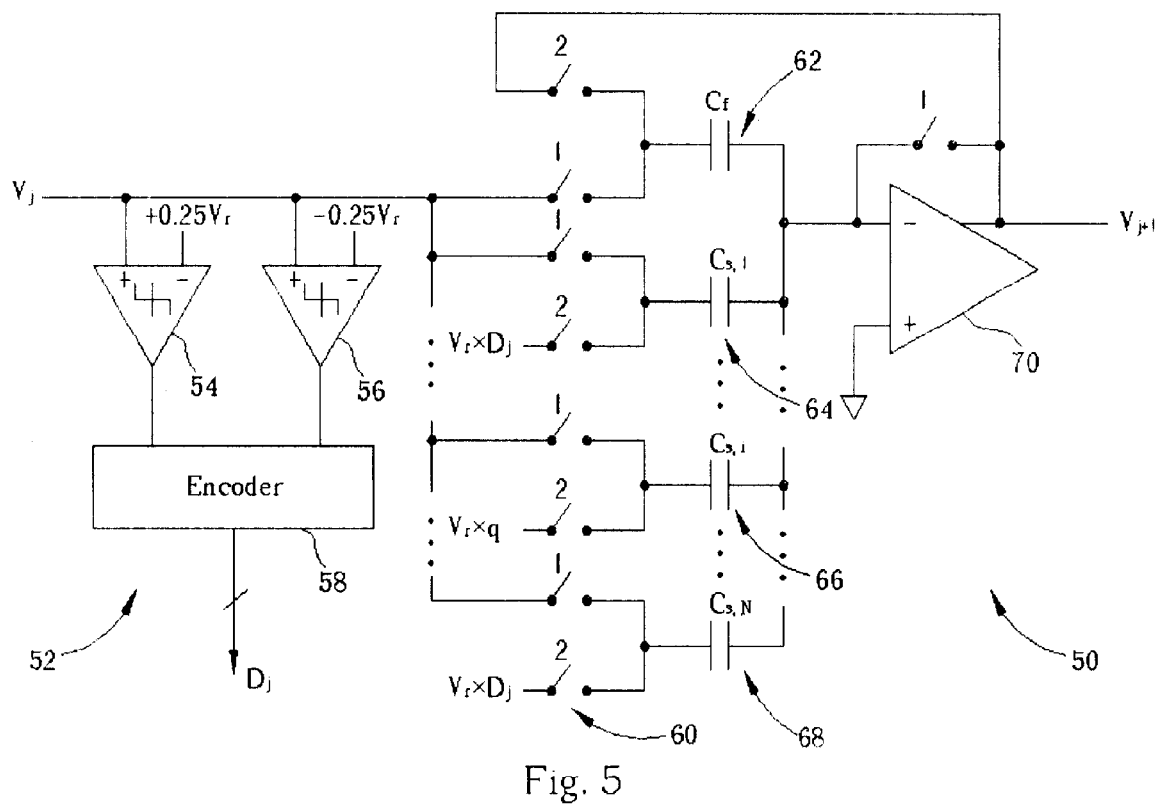
FIG. 5 is a block diagram of a radix-2 1.5 bit SC MDAC according to the present invention.

Please refer to FIG. 5 illustrating a block diagram of an MDAC 50 according to the present invention. The MDAC 50 is illustrated as a radix-2 1.5 bit SC MDAC, however, the present invention applies to other types of pipeline stages, such as those having multi-bit operation without switched capacitors.

The MDAC 50 includes a sub-ADC 52 for converting an input analog signal $V_j$ to a digital code $D_j$. The sub-ADC 52 includes comparators 54, 56 and an encoder 58 capable of producing 1.5 bit output, such as 00, "01, or 10, utilizing a reference voltage $V_r$. Detailed design and operation of the sub-ADC 52 is well known in the art. The MDAC 50 further comprises a plurality of switches 60 selectively connecting a first capacitor 62, and second capacitors 64, 66, 68 between the sub-ADC 52, the input analog signal V., and an amplifier 70. The second capacitors 64, 66, 68 are arranged in parallel and are capable of sharing the same input and output. The switches 60 can be realized with typical switching devices such as transistors. Each switch 60 closes and opens according to the operational phase of the MDAC 50.

That is, switches marked with a 1 in FIG. 5 are exclusively closed during a sample phase, while switches marked with a 2 are exclusively closed during a hold phase. The first capacitor 62 has a capacitance of $C_f$, and the second capacitors 64, 66, 68 have capacitances of $C_{s,1}$, $C_{s,i}$, $C_{s,N}$ respectively. Although, only three second capacitors 64, 66, 68 are illustrated, the present invention requires simply a minimum of two second capacitors, with a maximum of as many as practical. The sum of capacitances of all second capacitors 64, 66, 68 used in the MDAC 50 should be selected as nominally equal to the capacitance of the first capacitor 62 such that:

$$C_f = C_{s,1} + C_{s,2} + \ldots + C_{s,N}$$

In operation, during the sample phase, the switches 60 are set such that all capacitors 62, 64, 66, 68 are connected to sample the input signal $V_j$. Conversely, during the hold phase, the switches 60 are set such that second capacitors 64, 68 are connected to the reference voltage $V_r$ multiplied by the determined digital code $D_j$, while a selected second capacitor 66 can be connected to a first calibration signal, which is the reference voltage $V_r$ multiplied by a pseudo-random digital binary-valued sequence q. Whether any second capacitance receives the first calibration digital depends on if it is under calibration. The basis of selecting which second capacitor is to receive the first calibration signal should be sound design principles or otherwise whatever choice is convenient, as all second capacitors should eventually individually receive the first calibration signal. The sequence q alternates between +1 and 0 or between −1 and 0 depending on the digital code output $D_j$ as being a 1 or −1 respectively. As such, output $V_{j+1}$ of the MDAC 50 can be expressed as:

$$V_{j+1} = \hat{G}_j \times \left[ V_j - \hat{V}_j^{do}(D_j) + \frac{C_{s,i}}{C_f} V_r \cdot D_j - \frac{C_{s,i}}{C_f} V_r \cdot q \right] \quad (5)$$

where the actual gain of the amplifier 70 is $$\hat{G} = 1 + C_s/C_r, \quad C_f = C_s + C_r$$

and the actual analog signal generated based on the digital code $D_j$ is:

$$\hat{V}_j^{do}(D_j) = \frac{C_s}{C_s + C_f} V_r \cdot D_j = \frac{\sum_{n=1}^{N} C_{s,i}}{C_r} V_r \cdot D_j \quad (6)$$

Figure 1:
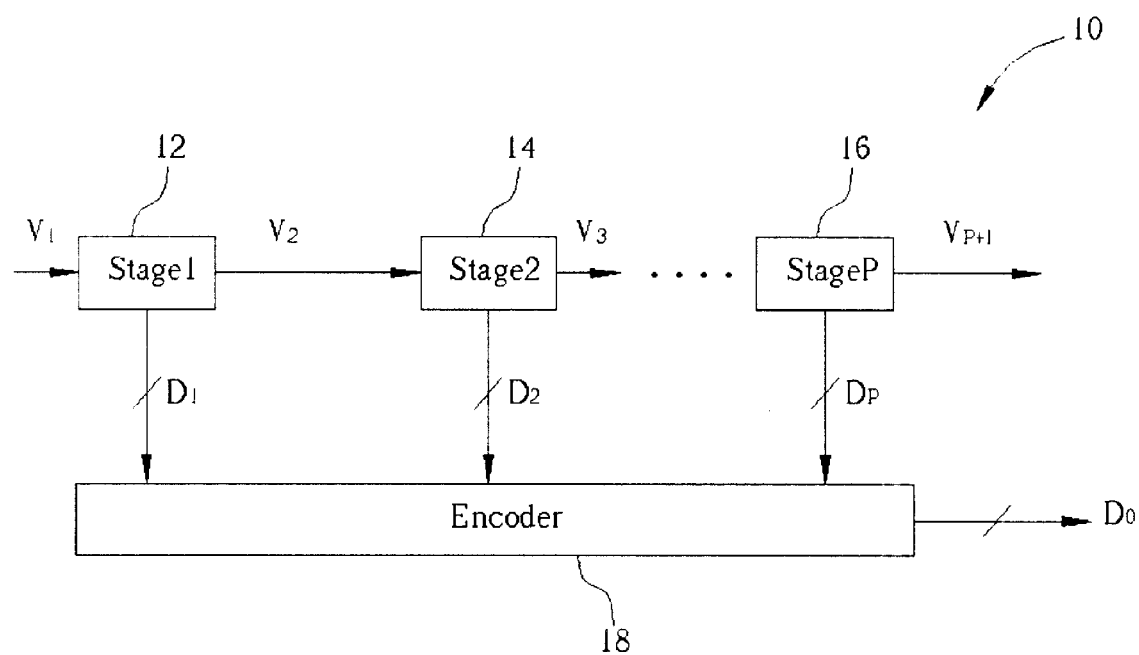
FIG. 1 is a block diagram of a prior art pipelined ADC.
Figure 2:
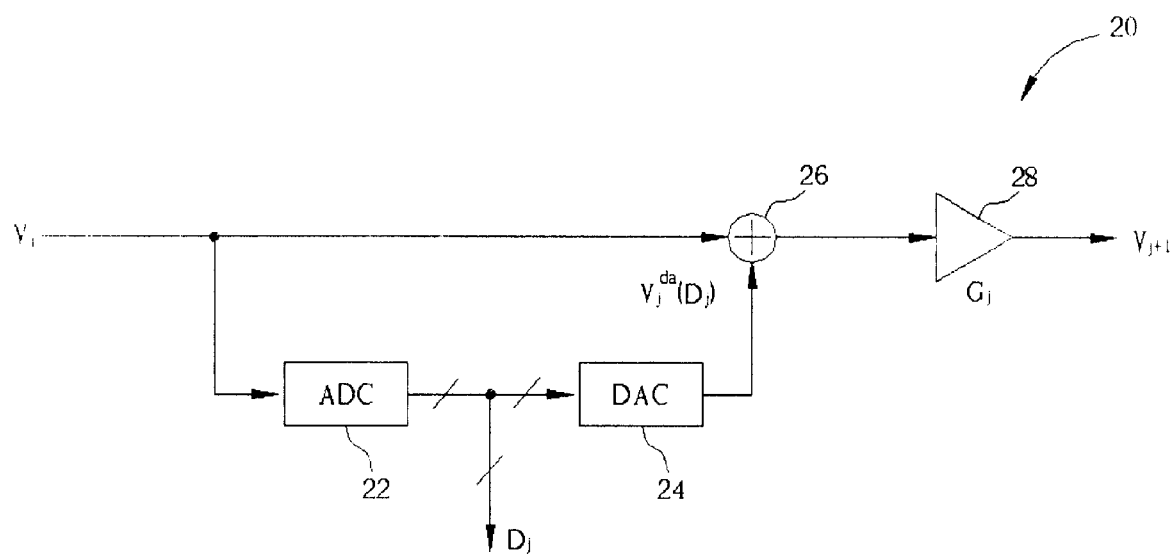
FIG. 2 is a block diagram of a prior art MDAC for the ADC of FIG. 1.
Figure 3:
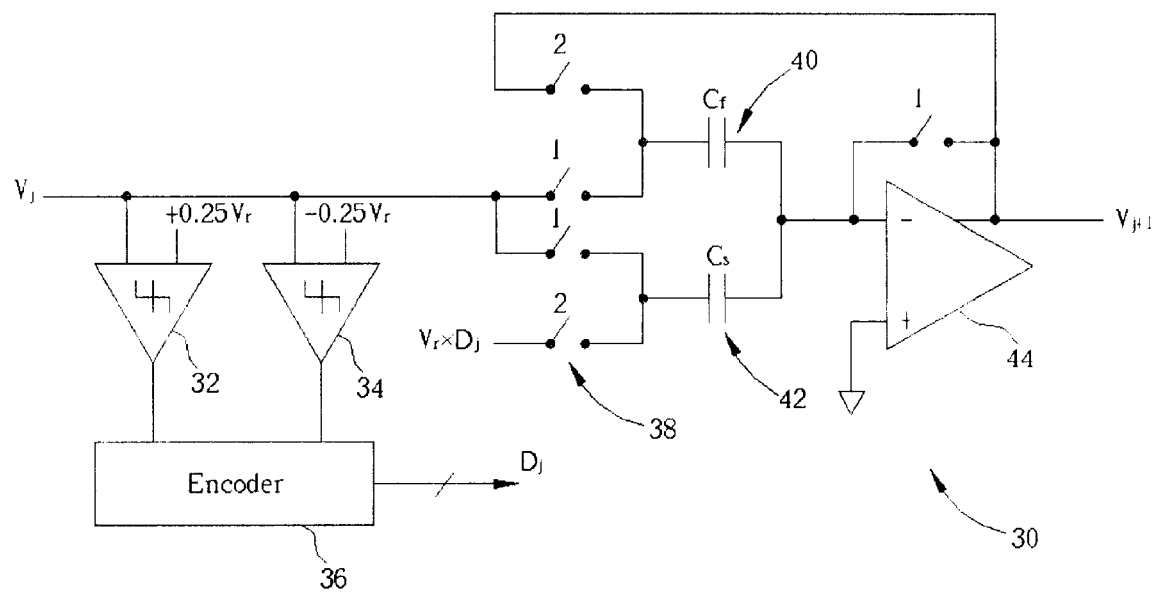
FIG. 3 is a block diagram of a prior art radix-2 1.5 bit SC MDAC.
Figure 4:
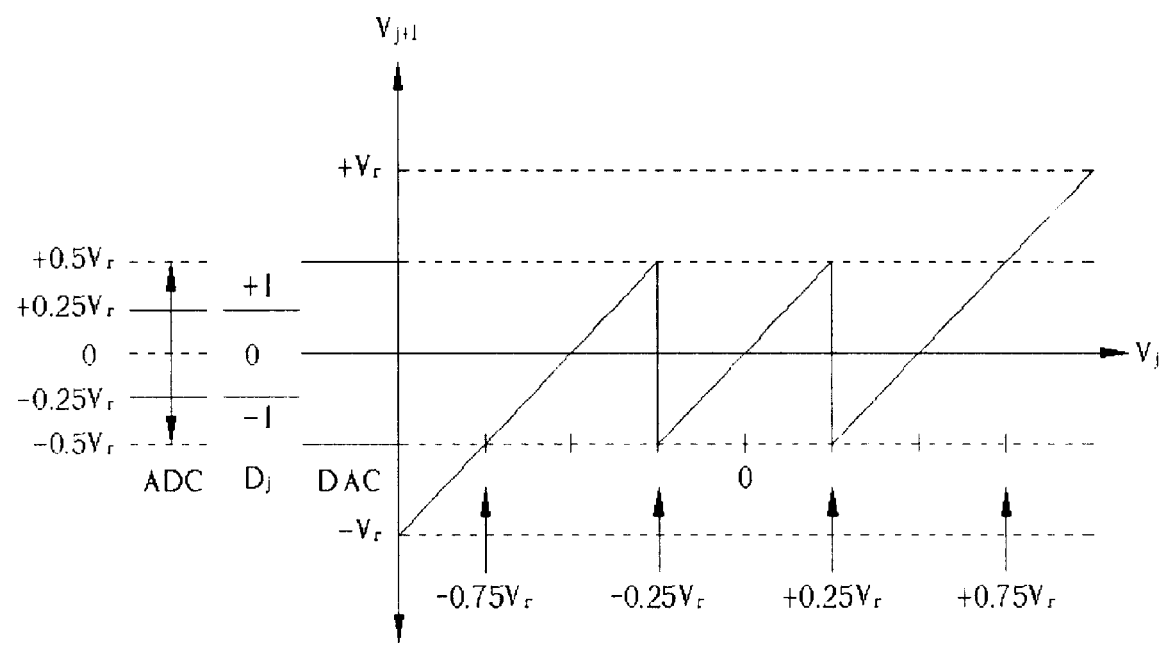
FIG. 4 is a graph of a conversion characteristic of a radix-2 1.5 bit SC MDAC.
Figure 6:
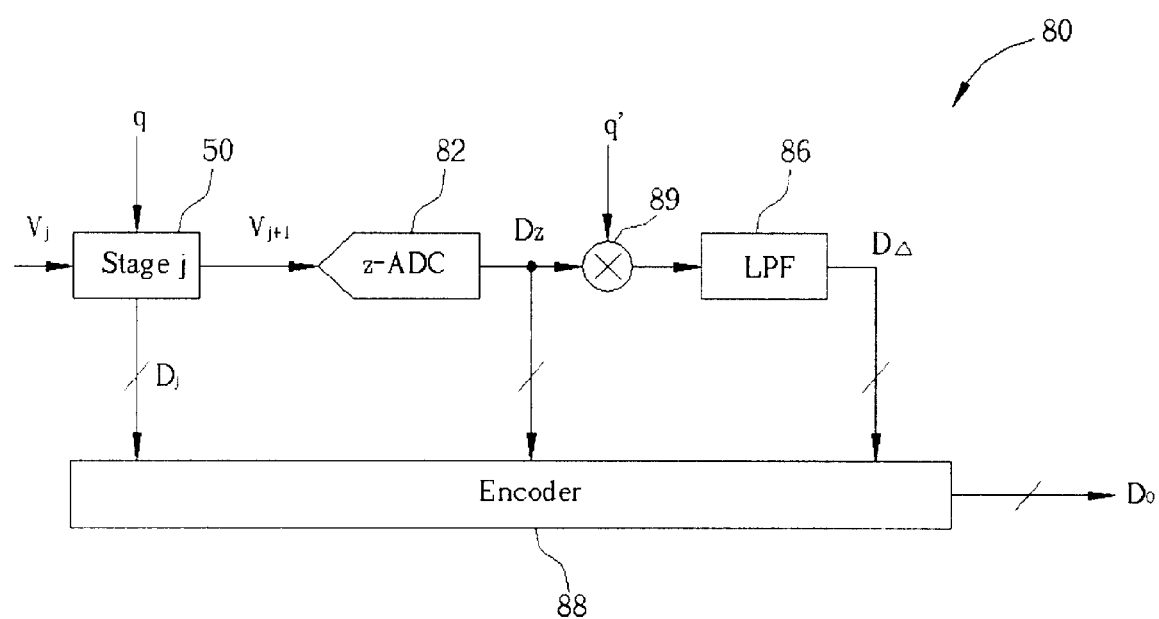
FIG. 6 is a block diagram of pipelined MDACs of FIG. 5.

How the random signal q is applied to the second capacitors 64, 66, 68 to effect background calibration is further described referencing FIG. 6, which illustrates a simplified (for purposes of explanation) ADC 80 incorporating the MDAC stage 50. When a plurality of MDAC stages 50 are connected in series to realize an ADC, such as the ADC 10 of FIG. 1, when considering operations of a particular stage, further LSB stage can be consolidated for simplification Accordingly, the ADC 80 includes an MDAC 50, a z-ADC 82 representing the combined LSB stages, a multiplier 89 for combining the output $D_z$ of the z-ADC 82 with a second calibration signal q corresponding to the first calibration signal q, a low-pass filter 86 for obtaining the DC component of the output $q \cdot D_z$ of the multiplier 89, and an encoder 88.

Generally, during operating, the random calibration signal q is injected into the second capacitors 64, 66, 68 of the MDAC 50, and removed from the digital output D of the MDAC 50 and the digital output $D_j$ of the z-ADC 82 at the encoder 88. This is facilitated by selecting the random sequence q as having the same waveform pattern as the random calibration sequence q, however, with values alternating between +1 and −1 (i.e. has zero DC component).

The MDAC 50 and ADC 80 inherently perform the following mathematical description, which is presented simply for a better understanding of the present invention. The value of from equation (5) is estimated by quantizing $V_{j+1}$ using the z-ADC 82, and then low pass filtering the product $q \cdot D_z$ in the digital domain with the low-pass filter 86. If the signal q has a mean value very close to 0, and is uncorrelated with V., then the DC component of the product $q \cdot D_z$ corresponds to the gain error of the z-ADC 82 by $$D_\Delta = \Delta, \hat{G}_c/G_c, \quad 7$$

where:

$$\Delta_1 = -\overline{q \cdot q} \times \hat{G}_j \frac{C_{s,i}}{C_f} V_r = -\frac{1}{2} \hat{G}_1 \frac{C_{s,i}}{C_f} V_r \quad (7)$$

And, by combining equations (6) and (7) above:

$$\hat{G}_j \times \hat{V}_j^{do}(D_j) = -2 \cdot D_j \times \sum_{i=1}^{N} \Delta_1 \quad (8)$$

Then, once the term $$\hat{G}_1 V_1^{do}(D_1)$$

for equation (8) is obtained for all values of $D_j$, the result $T_j(D_j)$ is determined as:

$$T_j(D_j) = \frac{D_z(D_j)}{G_j} \quad (9)$$

For normal A/D operation of the ADC 80, the digital output $D_0$ of the encoder 88 is $D_{jz}$ as below:

$$\text{Digital Output} = D_{jz} = T_j(D_j) + \frac{D_z}{G_j} \quad (10)$$

Note that the raw digital output $D_z$ of the z-ADC 82 includes the last two terms of equation (5), which must be subtracted from $D_z$ before calculating $D_{jz}$. Once $\Delta$, of equation (7) has converged, these two noise terms can be calculated with high precision and completely removed from $D_z$. Also note that in the above mathematical description, intermediate and supporting equations have been omitted for conciseness, however, these are well known knowledgeable in theories of digital calibration.

As a result, the voltage range for the output $V_{j+1}$ according to the present invention can be expressed as:

$$|V_{j+1}| \leq V_r \times \left( \frac{C_s + C_f}{4C_f} + \frac{C_{s,i}}{C_f} \right) \quad (11)$$

assuming that the comparators 54, 56 of FIG. 5 are ideal and the input $V_j$ is bounded between $\pm V_r$. As the present invention background calibration adds the random signal q into the output $V_{j+1}$, extra voltage range is required as indicated by the $C_{s,i}/C_f$ term in equation (11). Thus, it is desirable to select a smaller combined capacitance $C_s$ for second capacitors 64, 66, 68, or to use a larger number of second capacitors.

Figure 7:
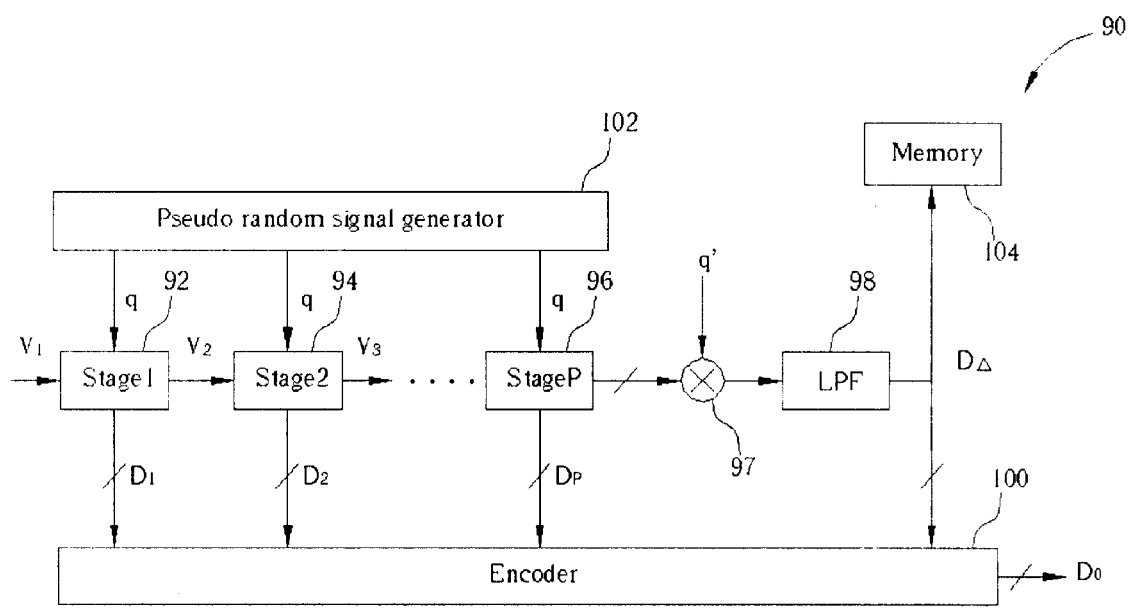
FIG. 7 is a block diagram of a pipelined ADC according to the present invention.

Please refer to FIG. 7, illustrating an ADC 90 as practically implemented according to the present invention. The ADC 90 includes a series of MDAC stages 92, 94, 96, which are identical to the present invention MDAC stage 50. Similar to the ADC 80, the ADC 90 also comprises a multiplier 97, a low-pass filter 98, and an encoder 100. The ADC 90 further comprises a pseudo-random signal generator 102 for generating the signals q, q, and a memory 104 for storing the DC component of the output D of the multiplexer 97. Three MDAC stages 92, 94, 96 are shown, however, more or fewer are acceptable. During A/D conversion operation of the ADC 90, an external analog signal $V_1$ is input into the first MDAC stage 92. The first MDAC stage 92 generates a corresponding digital code $D_1$, and outputs a residue analog signal $V_2$ to the second MDAC stage 94. This is continuously repeated according to sample and hold phases for all MDAC stages 92, 94, 96, with digital codes $D_1$, $D_2$, $D_p$ corresponding to the input analog signal $V_1$ being output to the encoder 100. To achieve calibration, the pseudo-random signal generator 102 generates the random calibration sequence q and progressively injects it into the second capacitors 64, 66, 68 (see FIG. 5) of the MDACs stages 92, 94, 96, beginning with the least significant bit MDAC to be calibrated and progressing to the most significant bit MDAC to be calibrated. The order in which the second capacitors 64, 66, 68 receive the signal q is unimportant, however, the LSB to MSB calibration order of the stages 92, 94, 96 should be maintained. To compensate for the random first calibration signal q, the pseudo random signal generator 102 also applies the corresponding second calibration signal q to the output of the last stage 96 of the ADC 90. The DC component D of this result is then produced by the low-pass filter 98, which outputs the DC component D to the encoder 100 and the memory 104. Finally, the encoder 100, supported by data in the memory 104, removes traces of the input random calibration sequence q to output the calibrated digital signal $D_0$.

Figure 8:
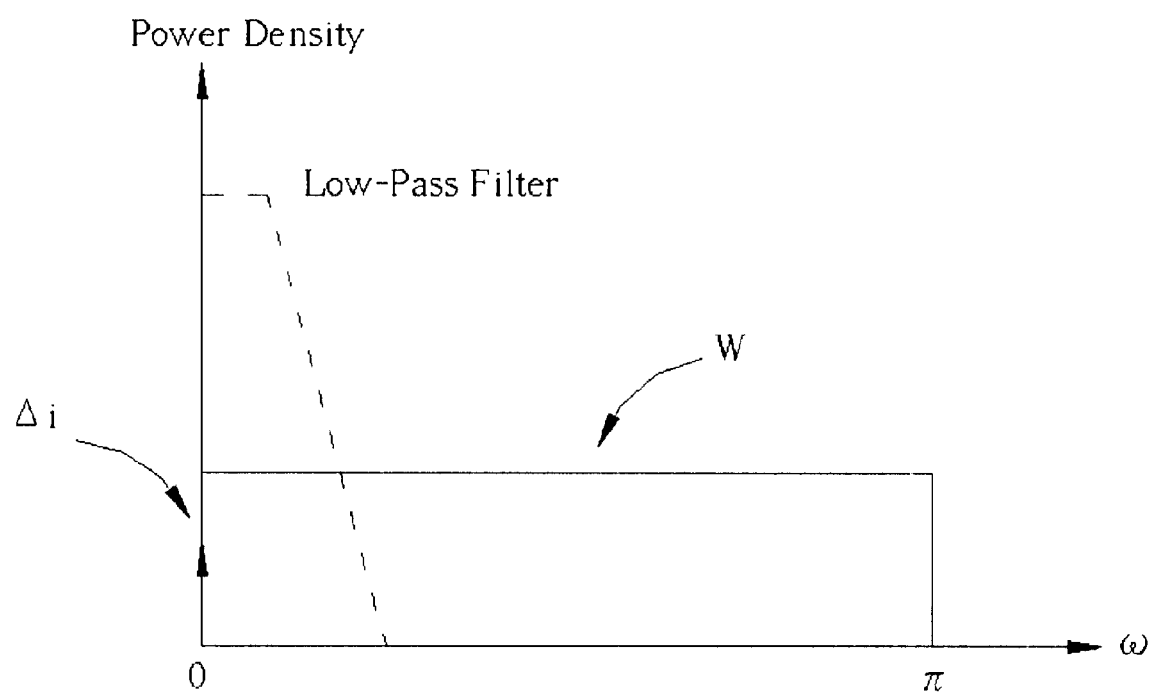
FIG. 8 is a graph of the effects of the low-pass filters of FIG. 6 and FIG. 7.

FIG. 8 illustrates the effects of the low-pass filters 86, 98 of FIG. 6 and FIG. 7 when used to extract Equation. Δ. from white noise W when suitably designed by one skilled in the art. The low-pass filters 86, 98 can be of typical designs, or can also be decimation filters, provided they are compatible with the above description of the present invention.

Figure 9:
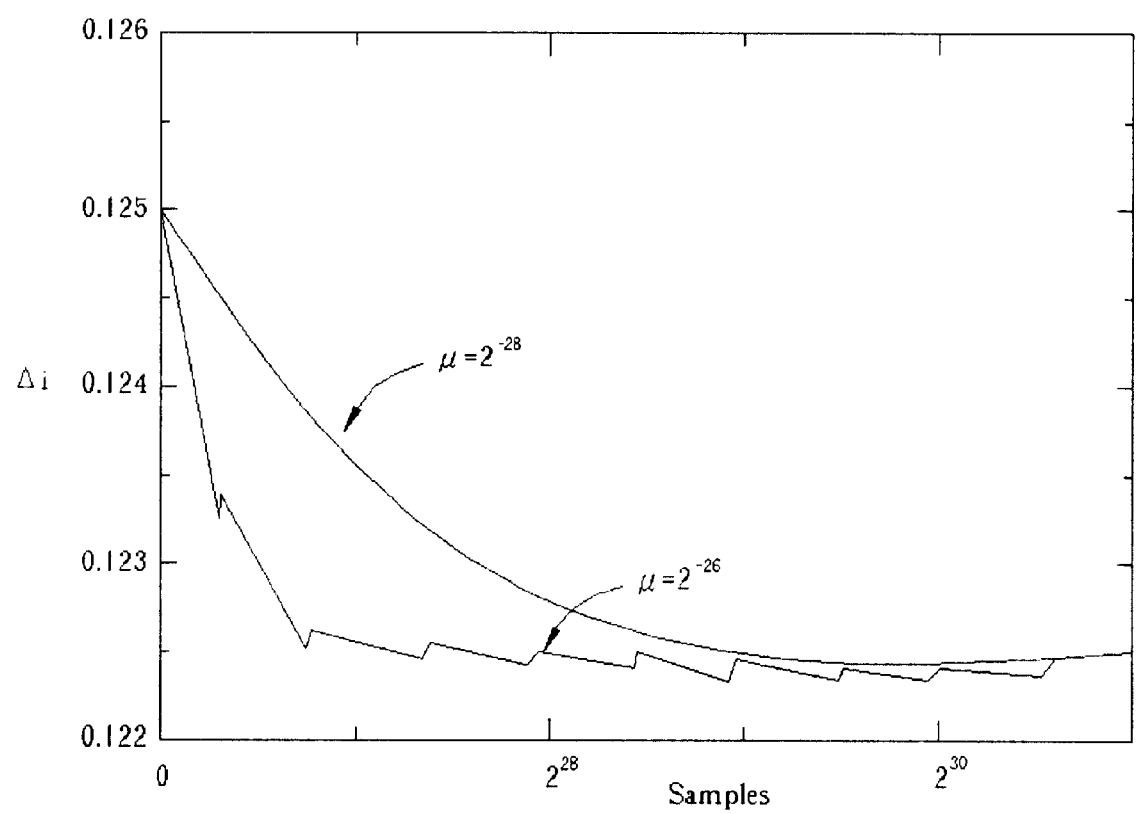
FIG. 9 is a graph of transient behaviors for low-pass filter designs according to the present invention.

Simultaions have been performed to demonstrate the benefits of the present invention background calibration. Referring back to FIG. 6, a simulated pipelined ADC was given an MDAC stage 50 followed by an ideal 17-bit z-ADC 82. The MDAC stage 50 was set with a non-ideal capacitor ratio of $C_s/C_f=0.98$ (2% mismatch) and an offset $V^{os}=0.01V_r$. The MDAC stage 50 was given four second capacitors (N=4) of equal capacitance. The input signal $V_j$ was a sinusoidal signal with $0.5V_r$ amplitude and a frequency of approximately ⅔ the sampling frequency. When the MDAC 50 was left uncalibrated the signal-to-noise-and-distortion ratio (SNDR) was measured as 43.4 dB, and the spurious-free dynamic range (SFDR) was 47.2 dB, resulting in an effective number of bits (ENOB) of 6.9 bits. When the present invention background calibration was applied with a well-designed low-pass filter 86 having p=2, the SNDR became 92.7 dB and the SFDR became 99.6 dB, resulting in an ENOB of 15.1 bits. When different $\mu$ values were applied to the low-pass filter 86, transient behaviors were as illustrated in FIG. 9, which shows that using a smaller $\mu$ value (for good resolution) requires a longer time for convergence.

When the low-pass filter was replaced with a suitably designed decimation filter having an M=2 28, the SNDR was 88.0 dB, arid the SFDR was 90.2 dB, resulting in an ENOB of 14.3 bits.

Figure 10:
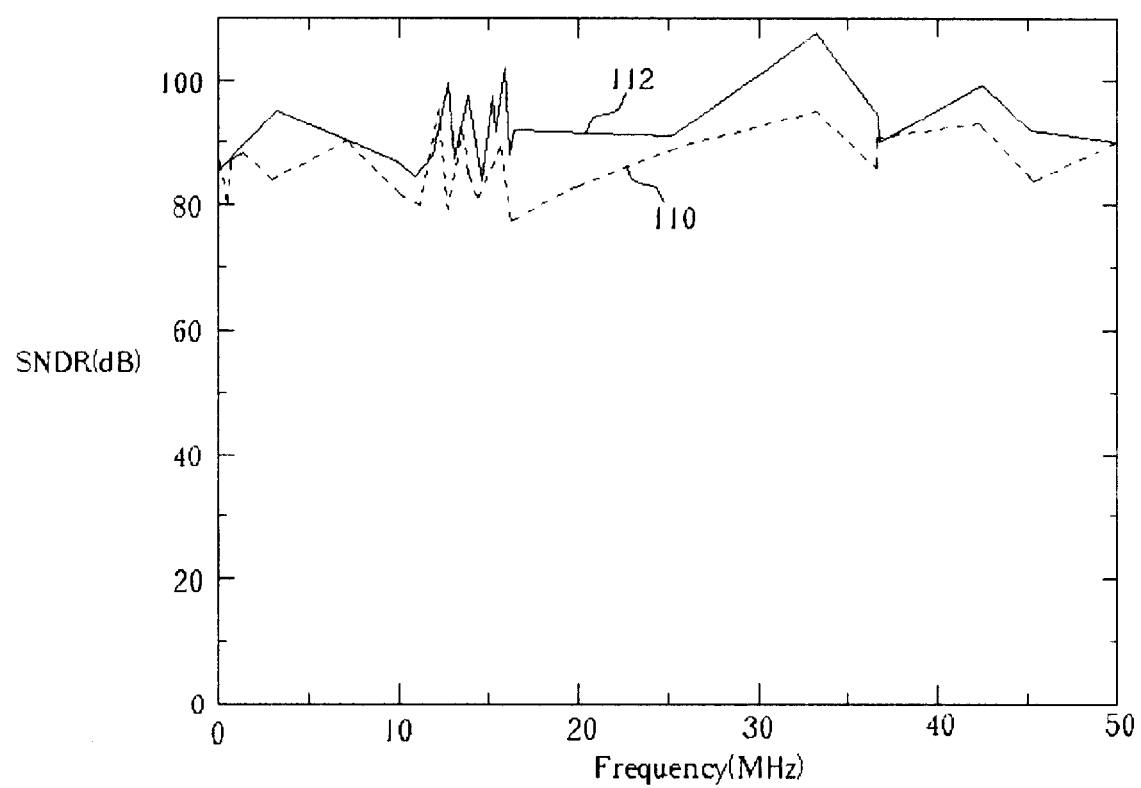
FIG. 10 is a graph of SNDR of the output of an ADC according to the present invention operated at different input frequencies.

FIG. 10 shows SNDR of the output of the simulated ADC at different input frequencies. The ADC was separately calibrated using both the previously described low-pass filter, as indicated by curve 110, and the decimation filter, as indicated by curve 112.

In contrast to the prior art, the present invention MDAC includes a plurality of second capacitances that are provided with a random calibration signal. The present invention MDAC, ADC, and method are capable of simultaneous calibration and A/D conversion. The present invention requires only a small modification of the analog signal path, and does not degrade operating speed, and further, reduces nonlinear effects due to capacitor mismatches, DC offset voltage, and reference voltage inaccuracy.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A multiplying digital-to-analog converter (MDAC) stage for a pipelined analog-to-digital converter, the MDAC stage comprising:
   an input node for receiving an analog signal;
   a sub-analog-to-digital converter for converting the analog signal to a digital code;
   an amplifier;
   a first capacitance selectively connected between the input node and the amplifier input and between the amplifier input and the amplifier output; and
   a plurality of second capacitances in parallel selectively connected between the input node and the amplifier input and between a corresponding plurality of digital reference signals and the amplifier input, the plurality of digital reference signals comprising digital signals corresponding to the digital code and a first calibration signal;
   wherein during a sample phase the first capacitance is connected, between the input node and the amplifier input and the plurality of second capacitances are connected in parallel between the input node and the amplifier input, and during a hold phase the first capacitance is connected between the amplifier input and the amplifier output and the plurality of second capacitances am connected in parallel between the plurality of digital reference signals and the amplifier input.

2. The MDAC stage of claim 1 wherein the sum of the plurality of second capacitances is nominally equal to the first capacitance.

3. A pipelined analog-to-digital converter comprising a series of MDAC stages of claim 1.

4. The piplined analog-to-digital converter of claim 3 further comprising:
   a multiplier connected to the output of the last MDAC stage of the series, thc multiplier for determining a product of the last MDAC stage output and a second calibration signal corresponding to the first calibration signal;
   a low-pass filter connected to the multiplier for filtering output of the multiplier and outputting a DC component, and an encoder for receiving output of the MDAC stages and generating a digital output signal, and for compensating the digital output signal with the DC component.

5. The pipelined analog-to-digital converter of claim 4 wherein the first and second calibration signals are random digital binary valued sequences having the same waveform shape.

6. The pipelined analog-to-digital converter of claim 4 further comprising a pseudo-random signal generator for generating the first and second calibration signals.

7. The pipelined analog-to-digital converter of claim 4 further comprising a memory for storing the DC component, the memory accessible by the encoder.

8. A method for background calibrating a pipelined analog-to-digital converter comprising a series of multiplying digital-to-analog converter (MDAC) stages, the method comprising:

sampling an input analog signal on a first capacitance and a plurality of second capacitances of an MDAC stage during a sample phase;

applying a first calibration signal to a second capacitance of the MDAC stage during a hold phase;

combining output of the last MDAC stage of the series with a second calibration signal corresponding to the first calibration signal; and filtering the second calibration signal from the digital output of the pipelined analog-to-digital converter.

9. The method of claim 8 further comprising sequentially applying the first calibration signal to second capacitances of all MDAC stages during corresponding hold phases, said sequential application being in order of increasing significant bit values of the MDAC stages.

10. The method of claim 8 wherein the sum of the plurality of second capacitances is nominally equal to the first capacitance.

11. The method of claim 8 where the first and second calibration signals are random digital binary-valued sequences having the same waveform shape.

* * * * *